United States Patent
Ishihara et al.

(10) Patent No.: US 9,130,542 B1
(45) Date of Patent: Sep. 8, 2015

(54) NOISE FILTER

(71) Applicant: KABUSHIKI KAISHA TOYOTA JIDOSHOKKI, Kariya-shi, Aichi (JP)

(72) Inventors: Yoshiaki Ishihara, Kariya (JP); Kazuji Yamazaki, Kariya (JP); Naoto Kikuchi, Nagakute (JP); Yoshitoshi Watanabe, Nagakute (JP)

(73) Assignee: KABUSHIKI KAISHA TOYOTA JIDOSHOKKI, Aichi-ken (JP)

( * ) Notice: Subject to any disclaimer, the term of this patent is extended or adjusted under 35 U.S.C. 154(b) by 0 days.

(21) Appl. No.: 14/614,944

(22) Filed: Feb. 5, 2015

(30) Foreign Application Priority Data

Mar. 4, 2014 (JP) ................................. 2014-041757

(51) Int. Cl.
   H03H 5/00      (2006.01)
   H03H 11/12     (2006.01)

(52) U.S. Cl.
   CPC .................................. *H03H 11/126* (2013.01)

(58) Field of Classification Search
   CPC .................................................... H03H 11/126
   USPC ............ 327/551–559; 363/40, 41, 39, 34, 37, 363/132
   See application file for complete search history.

(56) References Cited

U.S. PATENT DOCUMENTS

| 5,831,842 A * | 11/1998 | Ogasawara et al. ............. 363/40 |
| 6,316,970 B1 * | 11/2001 | Hebert ............................ 327/67 |
| 7,385,466 B2 * | 6/2008 | Suenaga et al. ................ 333/181 |
| 2004/0004514 A1 | 1/2004 | Pelly |

FOREIGN PATENT DOCUMENTS

| JP | 10-94244 A | 4/1998 |
| JP | 2010-0057268 A | 3/2010 |

* cited by examiner

*Primary Examiner* — Dinh Le
(74) *Attorney, Agent, or Firm* — Sughrue Mion, PLLC

(57) ABSTRACT

A noise filter disclosed herein is configured to suppress a common mode voltage that is generated in cables connected to an electric power converter. The noise filter includes: detecting capacitors connected to the cables, respectively, and configured to detect the common mode voltage; an operational amplifier having a positive input terminal via which the common mode voltage detected by the detecting capacitors is inputted; an emitter follower circuit having an input terminal connected to an output terminal of the operational amplifier and having an output terminal connected to a negative input terminal of the operational amplifier; and a transformer configured to apply a compensating voltage to each of the cables by applying a voltage at the output terminal of the emitter follower circuit to each of the cables in opposite phase.

6 Claims, 3 Drawing Sheets

NOISE FILTER

CROSS-REFERENCE TO RELATED APPLICATION

This application claims priority to Japanese Patent Application No. 2014-041757 filed on Mar. 4, 2014, the contents of which are hereby incorporated by reference into the present application.

TECHNICAL FIELD

The present specification relates to a noise filter.

DESCRIPTION OF RELATED ART

JP2010-57268A discloses a noise filter configured to suppress a common mode voltage that is generated in cables connected to an electric power converter. The noise filter includes: detecting capacitors connected to the cables, respectively, and configured to detect the common mode voltage; an emitter follower circuit having an input terminal via which the common mode voltage detected by the detecting capacitors is inputted; and a transformer configured to apply a compensating voltage to each of the cables by applying a voltage at an output terminal of the emitter follower circuit to each of the cables in opposite phase.

BRIEF SUMMARY OF INVENTION

It is desirable that the compensating voltage that is applied by the transformer have a gain of 1 (0 dB) and be opposite in phase (180 degrees) with respect to the common mode voltage that is detected by the detecting capacitors. The conventional noise filter can appropriately suppress a common mode voltage in a high frequency band with the gain being substantially 1 and with the phase being substantially opposite. However, a general emitter follower circuit varies greatly in both gain characteristics and phase characteristics in a low frequency band, although it has stable gain characteristics and phase characteristics in a high frequency band. For this reason, the conventional noise filter has had difficulty in appropriately suppressing a common mode voltage in a low frequency band.

The present specification provides a technology for solving the foregoing problems. The present specification provides a technology by which a noise filter configured to suppress a common mode voltage that is generated in cables connected to an electric power converter is configured to be able to appropriately suppress a common mode voltage in a low frequency band.

A noise filter disclosed herein is configured to suppress a common mode voltage that is generated in cables connected to an electric power converter. The noise filter includes: detecting capacitors connected to the cables, respectively, and configured to detect the common mode voltage; an operational amplifier having a positive input terminal via which the common mode voltage detected by the detecting capacitors is inputted; an emitter follower circuit having an input terminal connected to an output terminal of the operational amplifier and having an output terminal connected to a negative input terminal of the operational amplifier; and a transformer configured to apply a compensating voltage to each of the cables by applying a voltage at the output terminal of the emitter follower circuit to each of the cables in opposite phase.

The aforementioned noise filter is configured such that the common mode voltage detected by the detecting capacitors is inputted to the emitter follower circuit via the operational amplifier and the output from the emitter follower circuit is negatively fed back to the operational amplifier. This configuration makes it possible to compensate for the variation in gain characteristics and phase characteristics of the emitter follower circuit in a low frequency band. The common mode voltage that is generated in the cables can be suppressed from a high frequency band to a low frequency band.

The noise filter may be configured such that assuming that a is a gain of the voltage at the output terminal of the emitter follower circuit with respect to the common mode voltage that is inputted to the operational amplifier, a turns ratio of the transformer is adjusted to be $\alpha:1$.

In a case where the output from the emitter follower circuit is negatively fed back to the operational amplifier, the gain of the voltage at the output terminal of the emitter follower circuit with respect to the common mode voltage that is inputted to the operational amplifier is greater than 1. However, by thus adjusting the turns ratio of the transformer according to the gain, the gain of the compensating voltage that is applied by the transformer with respect to the common mode voltage that is detected by the detecting capacitors can be set to substantially 1 (0 dB). The common mode voltage can be more appropriately suppressed.

The noise filter may be configured to further include: a first resistor via which the output terminal of the emitter follower circuit and the negative input terminal of the operational amplifier are connected to each other; and a second resistor via which the negative input terminal of the operational amplifier and a neutral point of a power supply that supplies electric power to the operational amplifier are connected to each other.

The aforementioned noise filter makes it possible to appropriately improve the gain characteristics and phase characteristics of the emitter follower circuit in a low frequency band by adjusting the ratio between the resistance of the first resistor and the resistance of the second resistor and thereby adjusting the gain of the voltage at the output terminal of the emitter follower circuit with respect to the common mode voltage that is inputted to the operational amplifier. It should be noted that in a case where the neutral point of the power supply that supplies electric power to the operational amplifier is equal to the ground potential, the second resistor may connect the negative input terminal of the operational amplifier to the ground potential.

The noise filter may be configured to further include a common mode choke coil provided on the cables.

In the aforementioned noise filter, the magnitude of the compensating voltage to be applied by the transformer can be made smaller and the transformer can therefore be made smaller in size than in a case where the common mode choke coil is not provided. Further, the magnitude of the common mode voltage that is detected by the detecting capacitors becomes smaller than in the case where the common mode choke coil is not provided. This makes it possible to lower the power supply voltage that is to be supplied to the operational amplifier and to the emitter follower circuit.

The noise filter may be configured to further include Y capacitors connecting the cables to a ground potential, respectively.

In the aforementioned noise filter, the magnitude of the compensating voltage to be applied by the transformer can be made smaller and the transformer can therefore be made smaller in size than in a case where the Y capacitors are not provided. Further, in the noise filter, the magnitude of the common mode voltage that is detected by the detecting capacitors becomes smaller than in the case where the Y capacitors are not provided. This makes it possible to lower the power supply voltage that is to be supplied to the operational amplifier and to the emitter follower circuit.

The noise filter may be configured such that the Y capacitors are connected to the ground potential via a damping resistor.

The aforementioned noise filter makes it possible to more effectively carry out the suppression of the common mode voltage by the Y capacitors.

DETAILED DESCRIPTION OF INVENTION

Embodiment

Figure 1:
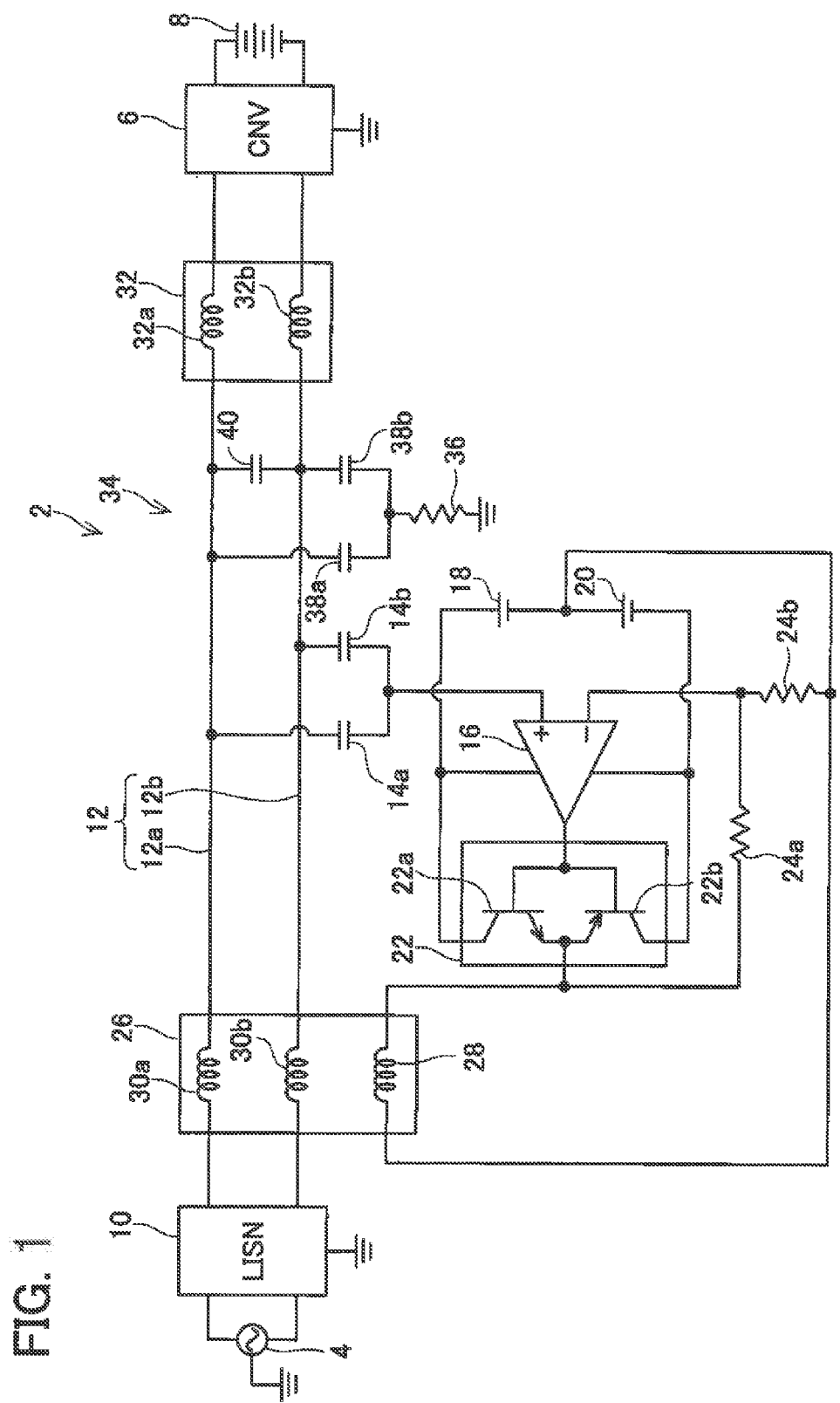
FIG. 1 is a diagram schematically showing a circuit configuration of a noise filter 2 of an embodiment.

FIG. 1 shows a circuit configuration of a noise filter 2 according to an embodiment of the present invention. A noise filter 2 of the present embodiment suppresses common mode noise that is generated on the side of a commercial system due to operation of an electric power converter 6 connected to an AC power supply 4 of the commercial system. In the present embodiment, the electric power converter 6 is a voltage PWM inverter containing switching elements such as IGBTs. The electric power converter 6 converts AC power supplied from the AC power supply 4 into DC power and supplies the DC power to a battery 8.

An LISN (Line Impedance Stabilization Network) 10 is connected to the AC power supply 4. The LISN 10 and the electric power converter 6 are connected to each other via cables 12. The cables 12 include a positive cable 12a and a negative cable 12b.

One end of a detecting capacitor 14a is connected to the positive cable 12a. One end of a detecting capacitor 14b is connected to the negative cable 12b. The other end of the detecting capacitor 14a and the other end of the detecting capacitor 14b are connected to each other at a point of connection connected to a positive input terminal of an operational amplifier 16.

The operational amplifier 16 is supplied with electric power from a first power supply 18 and a second power supply 20, both of which are DC power supplies. A positive power supply terminal of the operational amplifier 16 is connected to a positive electrode of the first power supply 18. A negative power supply terminal of the operational amplifier 16 is connected to a negative electrode of the second power supply 20. A negative electrode of the first power supply 18 is connected to a positive electrode of the second power supply 20. The point at which the negative electrode of the first power supply 18 and the positive electrode of the second power supply 20 are connected to each other is referred to also as a neutral point of a power supply that supplies electric power to the operational amplifier 16.

An output terminal of the operational amplifier 16 is connected to an input terminal of an emitter follower circuit 22. The emitter follower circuit 22 is a push-pull emitter follower circuit including an NPN transistor 22a and a PNP transistor 22b that are complementary to each other. The emitter follower circuit 22 is supplied with electric power from the first power supply 18 and the second power supply 20.

An output terminal of the emitter follower circuit 22 is connected to the point of connection between the negative electrode of the first power supply 18 and the positive electrode of the second power supply 20 via resistors 24a and 24b connected in series. The point of connection between the resistor 24a and the resistor 24b is connected to the negative input terminal of the operational amplifier 16. That is, the noise filter 2 of the present embodiment is configured such that the output from the emitter follower circuit 22 is negatively fed back to the operational amplifier 16.

A transformer 26 configured to apply a compensating voltage is provided closer to the AC power supply 4 than the points of connection of the detecting capacitors 14a and 14b to the cables 12. The transformer 26 includes a primary coil 28 and secondary coils 30a and 30b wound around a single core. The primary coil 28 is wound in the opposite direction to the secondary coils 30a and 30b, and a voltage opposite in phase to a voltage that is applied to the primary coil 28 is applied to the secondary coils 30a and 30b. One end of the primary coil 28 is connected to the output terminal of the emitter follower circuit 22, and the other end of the primary coil 28 is connected to the point of connection between the negative electrode of the first power supply 18 and the positive electrode of the second power supply 20. The secondary coil 30a is part of the positive cable 12a. The secondary coil 30b is part of the negative cable 12b.

A common mode choke coil 32 is provided closer to the electric power converter 6 than the points of connection of the detecting capacitors 14a and 14b to the cables 12. The common mode choke coil 32 includes a positive coil 32a and a negative coil 32b that are oppositely wound around a single core. The positive coil 32a is part of the positive cable 12a. The negative coil 32b is part of the negative cable 12b. The common mode choke coil 32 suppresses a common mode voltage generated in the positive coil 32a and the negative coil 32b.

A filter circuit 34 is provided between the points of connection of the detecting capacitors 14a and 14b to the cables 12 and the common mode choke coil 32. The filter circuit 34 includes: a damping resistor 36 having one end connected to the ground potential; a Y capacitor 38a connected between the positive cable 12a and the other end of the damping resistor 36; a Y capacitor 38b connected between the negative cable 12b and the other end of the damping resistor 36; and an X capacitor 40 connected between the positive cable 12a and the negative cable 12b. The Y capacitors 38a and 38b and the damping resistor 36 suppress a common mode voltage generated in the positive cable 12a and the negative cable 12b. The X capacitor 40 suppresses a differential mode voltage generated between the positive cable 12a and the negative cable 12b.

Operation of the noise filter 2 is described below. A common mode voltage that is generated in the cables 12 due to a switching operation of the electric power converter 6 is suppressed by the common mode choke coil 32, and is further suppressed by the filter circuit 34. The common mode voltage thus suppressed by the common mode choke coil 32 and the filter circuit 34 is detected by the detecting capacitors 14a and 14b, and is applied to the primary coil 28 of the transformer 26 via the operational amplifier 16 and the emitter follower circuit 22. As a result, a compensating voltage is applied to each of the secondary coils 30a and 30b of the transformer 26, so that the common mode voltage of the cables 12 is canceled out. In the noise filter 2 of the present embodiment, the gain a from the positive input terminal of the operational amplifier 16 to the output terminal of the emitter follower circuit 22 is given as α=1+R1/R2, where R1 is the resistance of the resistor 24a and R2 is the resistance of the resistor 24b. Therefore, the gain a is greater than 1. For this reason, when the turns ratio of the primary coil 28 and secondary coils 30a and 30b of the transformer 26 is α:1, a compensating voltage that is equal in magnitude and opposite in phase to the common mode voltage that is detected by the detecting capacitors 14a and 14b can be applied.

Figure 2:
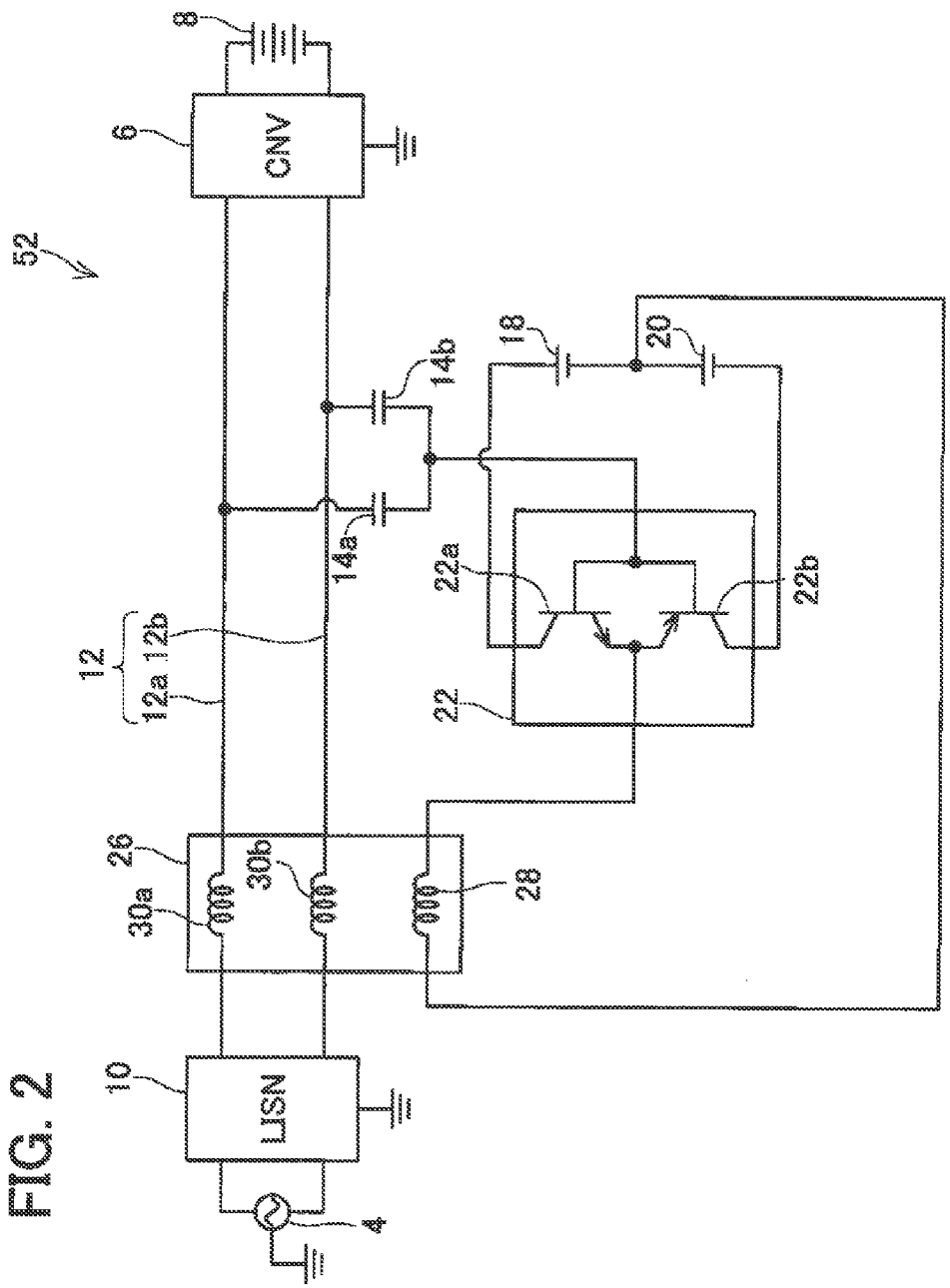
FIG. 2 is a diagram schematically showing a circuit configuration of a noise filter 52 of prior art.

FIG. 2 shows, as a comparative embodiment, a noise filter 52 of prior art. In the noise filter 52 of FIG. 2, unlike in the noise filter 2 of FIG. 1, the cables 12 are not provided with a common mode choke coil 32 or a filter circuit 34. Further, unlike the noise filter 2 of FIG. 1, the noise filter 52 of FIG. 2 is not provided with an operational amplifier 16 to which the output from the emitter follower circuit 22 is negatively fed back. Instead, a common mode voltage that is detected by the detecting capacitors 14a and 14b is directly inputted to the input terminal of the emitter follower circuit 22.

Figure 3:
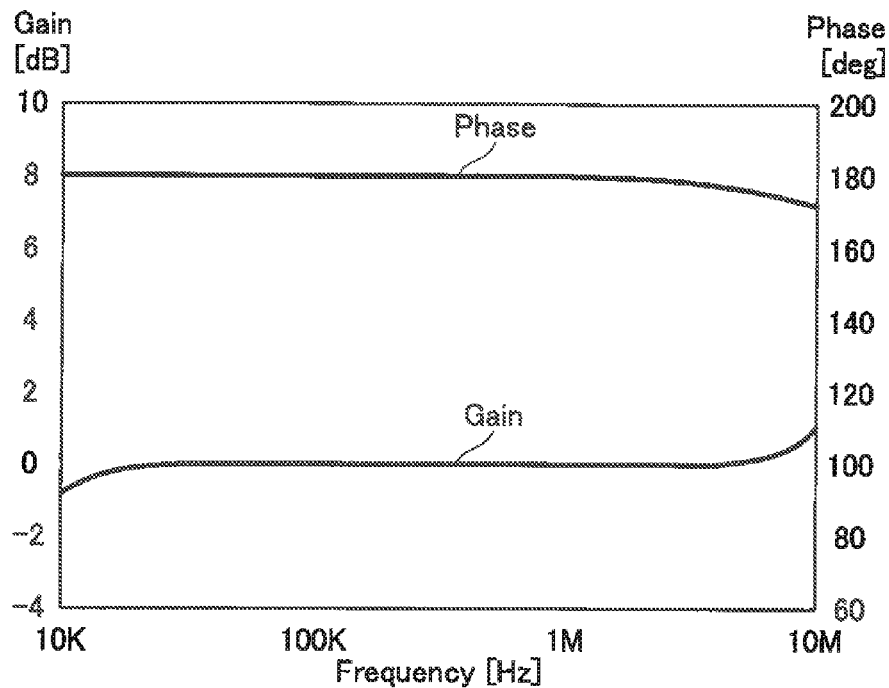
FIG. 3 is a diagram showing the gain characteristics and phase characteristics of the noise filter 2 of FIG. 1.
Figure 4:
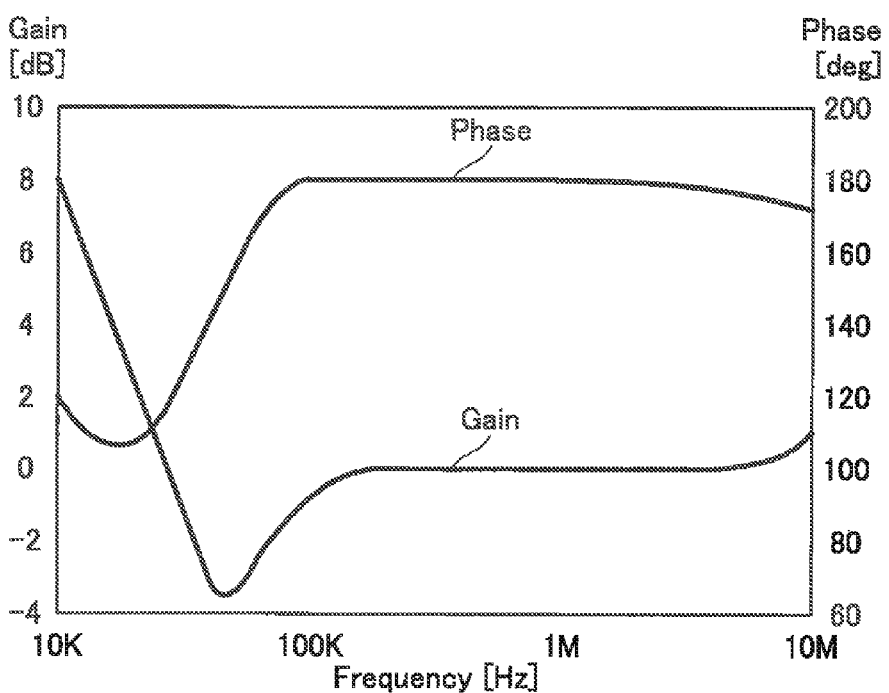
FIG. 4 is a diagram showing the gain characteristics and phase characteristics of the noise filter 52 of FIG. 2.

FIG. 3 shows the gain characteristics and phase characteristics of the noise filter 2 shown in FIG. 1. FIG. 4 shows the gain characteristics and phase characteristics of the noise filter 52 shown in FIG. 2. FIG. 3 and FIG. 4 each show a gain and a phase with the input being a common mode voltage that is detected by the detecting capacitors 14a and 14b and with the output being a compensating voltage that is applied to the secondary coils 30a and 30b of the transformer 26. As shown in FIG. 4, the noise filter 52 of prior art shown in FIG. 2 can appropriately suppress a common mode voltage in a high frequency band with the gain being substantially 1 (0 dB) and with the phase being substantially opposite (180 degrees). However, in a low frequency band, the gain deviates greatly from 1 and the phase deviates greatly from the opposite phase, with the result that a common mode voltage cannot be appropriately suppressed. This is due to the frequency characteristics of the emitter follower circuit 22. Depending on the base-emitter capacitance characteristics of transistors that are used in the emitter follower circuit 22, it becomes impossible to appropriately suppress a common mode voltage in the frequency band of a switching operation of the electric power converter 6 (i.e. the frequency band of the common mode voltage).

On the other hand, as shown in FIG. 3, the noise filter 2 of the present embodiment shown in FIG. 1 is stable in gain at substantially 1 (0 dB) and stable in phase substantially at opposite phase (180 degrees) from a high frequency band to a low frequency band. This is because the variation in gain characteristics and phase characteristics of the emitter follower circuit 22 in a low frequency band is compensated for by causing the output from the emitter follower circuit 22 to be negatively fed back to the operational amplifier 16. The noise filter 2 of the present embodiment shown in FIG. 1 makes it possible to appropriately suppress a common mode voltage from a high frequency band to a low frequency band.

The noise filter 2 of the present embodiment includes the Y capacitor 38a connecting the positive cable 12a to the ground potential and the Y capacitor 38b connecting the negative cable 12b to the ground potential. This makes it possible to suppress a common mode voltage that is generated in the positive cable 12a and the negative cable 12b. Further, the noise filter 2 of the present embodiment has its Y capacitors 38a and 38b connected to the ground potential via the damping resistor 36. This makes it possible to more effectively suppress a common mode voltage that is generated in the positive cable 12a and the negative cable 12b.

The noise filter 2 of the present embodiment includes the common mode choke coil 32. This makes it possible to suppress a common mode voltage that is generated in the positive cable 12a and the negative cable 12b.

In the noise filter 2 of the present embodiment, a common mode voltage is suppressed by the common mode choke coil 32 and the filter circuit 34. For this reason, the magnitude of the compensating voltage to be applied by the transformer 26 can be made smaller and the transformer 26 can therefore be made smaller in size than in a case where the common mode choke coil 32 and the filter circuit 34 are not provided. Further, the magnitude of a common mode voltage that is detected by the detecting capacitors 14a and 14b becomes smaller than in the case where the common mode choke coil 32 and the filter circuit 34 are not provided. This makes it possible to lower the power supply voltage that is to be supplied to the operational amplifier 16 and to the emitter follower circuit 22. Accordingly, the first power supply 18 and the second power supply 20 can be made smaller in size.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A noise filter configured to suppress a common mode voltage that is generated in cables connected to an electric power converter, comprising:
   detecting capacitors connected to the cables, respectively, and configured to detect the common mode voltage;
   an operational amplifier having a positive input terminal via which the common mode voltage detected by the detecting capacitors is inputted;
   an emitter follower circuit having an input terminal connected to an output terminal of the operational amplifier and having an output terminal connected to a negative input terminal of the operational amplifier; and
   a transformer configured to apply a compensating voltage to each of the cables by applying a voltage at the output terminal of the emitter follower circuit to each of the cables in opposite phase.

2. The noise filter according to claim 1, wherein assuming that a is a gain of the voltage at the output terminal of the emitter follower circuit with respect to the common mode voltage that is inputted to the operational amplifier, a turns ratio of the transformer is adjusted to be α:1.

3. The noise filter according to claim 1, further comprising:
   a first resistor via which the output terminal of the emitter follower circuit and the negative input terminal of the operational amplifier are connected to each other; and
   a second resistor via which the negative input terminal of the operational amplifier and a neutral point of a power supply that supplies electric power to the operational amplifier are connected to each other.

4. The noise filter according to claim 1, further comprising a common mode choke coil provided on the cables.

5. The noise filter according to claim 1, further comprising Y capacitors connecting the cables to a ground potential, respectively.

6. The noise filter according to claim 5, wherein the Y capacitors are connected to the ground potential via a damping resistor.

* * * * *